United States Patent [19]

Zumkeller et al.

[11] Patent Number: 4,924,045

[45] Date of Patent: May 8, 1990

[54] PUSH BUTTON FOR A VALUE INPUT KEYBOARD

[75] Inventors: Oskar Zumkeller, Villingen-Schwenningen; Hugo Fesenmeieir, Bräunlingen, both of Fed. Rep. of Germany

[73] Assignee: Mannesmann Kienzle GmbH, Villingen, Fed. Rep. of Germany

[21] Appl. No.: 396,750

[22] Filed: Aug. 18, 1989

Related U.S. Application Data

[63] Continuation of Ser. No. 178,468, Apr. 7, 1988, abandoned.

[30] Foreign Application Priority Data

Apr. 7, 1987 [DE] Fed. Rep. of Germany ... 8705193[U]

[51] Int. Cl.[5] .............................................. H01G 5/16
[52] U.S. Cl. .................................. 200/341; 336/118; 200/296
[58] Field of Search ................ 200/341, 296; 336/118, 336/136

[56] References Cited

U.S. PATENT DOCUMENTS

| | | | |
|---|---|---|---|
| 3,719,902 | 3/1973 | Esterly | 336/118 |
| 4,408,252 | 10/1983 | Voge et al. | 200/340 X |
| 4,463,237 | 7/1984 | Kim | 200/340 |

Primary Examiner—Renee S. Luebke
Attorney, Agent, or Firm—Toren, McGeady & Associates

[57] ABSTRACT

A push button for a keyboard wherein a detent, provided at the keyboard base on the side opposite to that of a guidance sleeve, is designed centrally to the passage aperture of the guidance sleeve, a lug is molded on the side of the keyboard base carrying the detent, the shaft on the push-button head is slotted and a nose or dog is radially molded on at least one of the resulting resilient shaft, this nose or dog coacting with a stop face formed on the keyboard base, a finger is formed on the push-button head parallel to the shaft and a guidance aperture for engaging the finger is formed in the lug molded on the keyboard base.

1 Claim, 1 Drawing Sheet

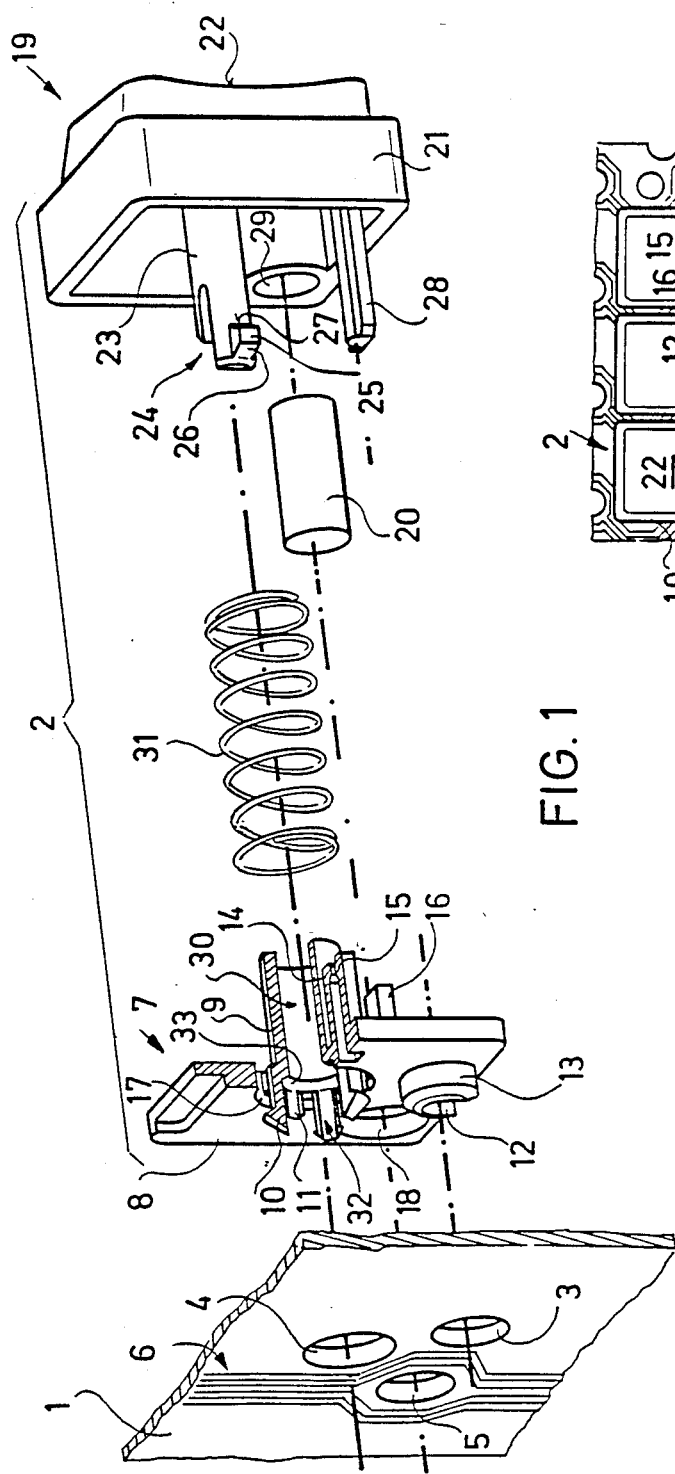
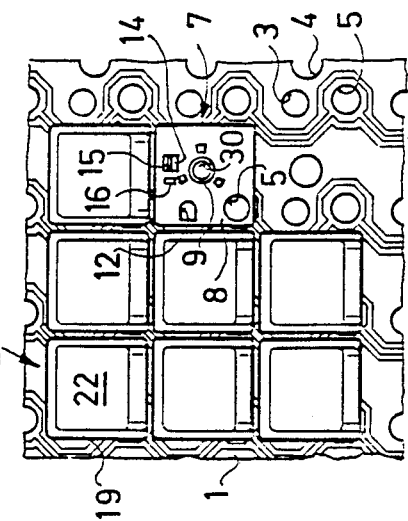
FIG. 1
FIG. 2

PUSH BUTTON FOR A VALUE INPUT KEYBOARD

This is a continuation application of Ser. No. 07/178,468, filed Apr. 4, 1989, now abandoned.

BACKGROUND OF THE INVENTION

1. Field of the Invention

The subject invention is related to a push button for a value input keyboard, having a keyboard base, on which, on the one hand, a guidance sleeve is molded and, on the other hand, detent or arresting means are constructed which serve for attaching the keyboard base to the printed circuit board. The push button further has a key or push-button head on which is molded a shaft for engaging the guidance sleeve, a pressure spring effective between the keyboard base and the push-button head, and stop means for limiting the stroke of the push button in the non-actuated state.

2. Description of Related Art

In a plurality of data acquisition and data processing appliances, value input keyboards, for example, ten-key clusters, alphanumerical keyboards or functional keyboards, are either integrated as autonomous components or are increasingly assigned as individual aggregates to be freely movable.

Requirements specifying error-free operability of the respective keyboards, ergonomic design of the push-button heads, geometrical optimization and unification of the push-button configuration, and as shallow a type of construction as possible, lead to an extensive standardization and thus to high quantities, which is a precondition for fabrication in large series and mechanized assembly.

The preferred structural concept of keyboards of this type involves installing functionally ready individual push buttons onto a printed circuit board acting as a carrier for the respective keyboard, preferably by means of suitable snap-in connections. Such a concept facilitates the build-up of random push-button configurations as well as changing them, it being easy to repair and also economical to produce even in small series.

Fabrication in large series and especially a mechanized assembly of keyboards requires, however, additionally, that the keyboard involved is produced with as few work steps as possible and with relatively simple components as far as molding technology is concerned, and that the assembly can occur without subsequent adjustment, and namely, with a high reproducibility as far as the alignment of the individual push buttons with respect to each other is concerned, customary fabrication tolerances and functional play between keyboard base and push-button head need generally not be reduced because of the plastic material guidance between the two components. Herein, we are not only dealing with as accurate an alignment of the keyboard bases of the individual push buttons as possible, but rather, especially, also with a respectively identical position of the push-button heads or their actuation surfaces in the unactuated state. This is indispensable particularly is keyboards are to be provided with printed legends in a touchless manner, for instance, with the use of a laser or similar energy beam.

SUMMARY OF THE INVENTION

It is an object of the present invention to provide a keyboard architecture which meets the requirement of fabrication in large series and which permits an optimum alignment of individual push button buttons as a bundle into a keyboard with the tolerances customary in large series fabrication.

The above object is achieved in a push button for a keyboard wherein the detent means provided at the keyboard base on the side opposite to that of the guidance sleeve is designed centrally to the passage aperture of the guidance sleeve, a lug is molded on the side of the keyboard base carrying the detent means, the shaft on the push-button head is slotted and a nose or dog is radially molded on at least one of the resulting resilient shaft darts, this nose or dog coacting with a stop face formed on the keyboard base. A finger is formed on the push-button head parallel to the shaft and a guidance aperture for engaging the finger is formed in the lug molded on the keyboard base.

This push button affords the advantage that it can be assembled using only three components, namely, a keyboard base, a push-button head and a pressure spring, (excluding the means for emitting the signal). Another advantage consists in that, because the snap-in elements are arranged on the keyboard base centrally to the guidance sleeve, and the lug, provided for these elements as security against turning, is spaced as far as possible from them, only two holes are necessary in the printed circuit board for fastening the push button onto the printed circuit board as well as for the passage of the shaft of the push-button head through the circuit board, which is required for guidance accuracy in view of the shallow construction. Furthermore, the solution of arresting the push-button head by means of noses or dogs molded on the shaft has the advantage that the push-button head is arrested in the effective line of the spring force and thus a centering of the push-button head occurs with appropriate shaping of the surfaces coacting during the snap-in or arresting process without causing any appreciable tilting moment. As such, one achieves an accurate, almost play-free final position of the push-button head and slanting of the gripping surface is avoided.

Finally, these measures enable that the push button can be designed to be more shallow and can be assembled with a minimum of components, since locks or snap-in hooks molded at the base in a conventional manner, to which have to be assigned suitable recesses in the push-button head which are covered by a push-button cap, can be eliminated. This evidently also provides additional space within the push-button head, which can, for example, be utilized for a bearing of a bracket serving for guidance of a twin or long push button. While with an individual push button such a bearing has no useful function, a twin push button requires a guidance bracket and is assigned the bases of two individual push buttons. Hence, it is avoided that different bases have to be fabricated and handled for single and twin push buttons.

It is naturally required in the arresting arrangement of the push-button head to equip the push-button head also with an effective security against turning. The solution of having a finger, molded on the push-button head so as to be eccentric to the shaft, engage into an aperture in the lug molded on the keyboard base, makes an additional opening in the circuit board unnecessary. The security of the keyboard base against turning is, so to speak, "shared" by the push-button head. It should furthermore be mentioned that the forming technology expense involved in the fabrication of the keyboard base and the push-button head is relatively low and, in any case, slide bars on the side are avoided.

BRIEF DESCRIPTION OF THE DRAWING

With the above and additional objects and advantages in mind as will hereinafter appear, the invention will be described with reference to the accompanying drawing, in which:

FIG. 1 is an exploded illustration to the push button of the subject invention assigned to a printed circuit board; and FIG. 2 is a sectional view of a partially installed keyboard in plan view.

DESCRIPTION OF THE PREFERRED EMBODIMENT

In the exploded illustration in FIG. 1, a section of a printed circuit board is designated with the reference number 1, in which holes 3, 4 and 5 are formed for use with the push button 2. Crossing conductor strips 6 are applied to both sides of the circuit board 1 which, together with the hole 5, constitute an induction coil, indicating that the signal emission in the selected embodiment occurs inductively. This is not essential to the invention but is mentioned for the sake of completeness.

FIG. 1 further shows a keyboard base 7 essentially consisting of a flat plate 8, on which are molded a guidance sleeve 9 and snap-in hooks 10 and centering dogs 11, arranged centrally to the guidance sleeve 9. A lug 13 having an aperture 12 therein, is arranged on the same side as the snap-in hooks 10 and the centering dogs 11. Resilient jaws 14 and 15 as well as a support 16 are provided as bearings for a guidance bracket of a twin or long push button. A cylindrical countersink 17 serves for increasing the flexural length of the snap-in hooks 10, while an aperture 18 is provided as a recess for the passage of a ferrite core 20, retained in the pushbutton head 19, which enters into the hole 5 of the printed circuit board 1 when the push button 2 is actuated.

The push-button head 19 includes a hollow member 21 essentially open on one side, the other side, depending on the application, being structured in a suitable manner and is equipped with a gripping face 22. A shaft 23 molded in the open side of the hollow member 21 is provided with an axially oriented slot 24. A radially oriented dog 25, having surfaces 26 and 27 bevelled in the axial direction of the shaft 23, is molded on the shaft segment created by the slot 24. In addition, a finger 28 is molded on the open side of the hollow member 21 parallel to the shaft 23 and engages the aperture 12 in the keyboard base 7 and is guided therein when the keyboard base 7 and the push-button head 19 are assembled. A blind opening 29 serves as a receptacle for the ferrite core 20; the passage aperture in the guidance sleeve 9 is designed with the number 18.

The assembly of the push button 2 on the circuit board 1 occurs, as shown in FIG. 2, preferably by means of a sequential process, meaning to begin with, the keyboard base 7 is snapped into the circuit board 1, wherein the snap-in hooks 10 grip behind the circuit board 1 through the aperture 4 and the lug 13 engages the aperture 3. Subsequently, a pressure spring 31 is placed upon the guidance sleeve 9 and the push-button head 19, in which the ferrite core 20 has been previously installed, is placed in such a way that the finger 28 is guided in the aperture 12 located in the lug 13 and the dog 25 molded on the shaft 23 snaps into a countersink 32 formed in the passage aperture 30 of the guidance sleeve 9. In the end or non-actuated position of the push button 2, the bevelled surface 27 of the dog 25 and a preferably conically-shaped annular stop face 33, formed by the countersink 32, cooperate together.

It is conceivable, for improvement of the centering, to subdivide the end of the shaft 23, for example, into three resilient segments at which suitable snap-in elements are molded. Furthermore, it should be mentioned that the guidance sleeve 9 can be diagonally offset by a specific dimension with respect to the essentially square plate 8 of the keyboard base 7 and that the lug 13 is molded on the same diagonal, spaced as far as possible from the guidance sleeve 9. A particularly economic solution can be achieved for an inductive keyboard, in that the ferrite core is received in a central aperture in the shaft of the push-button head 19. In this solution, only two apertures are then required in the printed circuit board 1.

Numerous alterations of the structure herein disclosed will suggest themselves to those skilled in the art. However, it should be understood that the present embodiment is for purposes of illustration only and is not to be construed as a limitation of the invention. All such modifications which do not depart from the spirit of the invention are intended to be included within the scope of the appended claims.

What is claimed is:

1. A push button for a value input inductive keyboard, comprising: a one-piece keyboard base to which a longitudinal guidance sleeve is molded on one side thereof and snap-in means are provided on another side thereof for fastening the keyboard base to a printed circuit board, the snap-in means including snap-in hooks arranged so as to engage the circuit board through a hole therein so that the keyboard base lies essentially flat on one side of the circuit board and the hooks project beyond the other side of the circuit board a very small distance in comparison to the guidance sleeve length; a one-piece push-button head having a lower side and a shaft integrally molded on the lower side so as to be engagable with the guidance sleeve; a pressure spring effective between the keyboard base and the push-button head; a ferrite core attached to the lower side of the push-button head so as to engage in respective holes in the keyboard base and the printed circuit board; and stop means for limiting the stroke of the push button in a non-actuated state thereof, the guidance sleeve having a pass-through aperture formed therethrough for receiving said shaft, the snap-in means being centrally located about said aperture, and a lug integrally molded on the same side of said keyboard base as said snap-in means, said lug being formed with a guidance aperture therethrough, said shaft on said push-button head having an axial slot forming resilient shaft segments, and a dog radially molded on at least one of the resilient shaft segments so as to cooperate with a stop face formed in said keyboard base, said push-button head further having a finger molded integrally therewith on the lower side so as to be substantially parallel to said shaft and engagable with said guidance aperture formed in said lug with a close tolerance so as to prevent relative turning of said head and said base.

* * * * *